(12) United States Patent
Anderson et al.

(10) Patent No.: US 7,354,794 B2
(45) Date of Patent: Apr. 8, 2008

(54) PRINTED CONDUCTIVE CONNECTORS

(75) Inventors: Frank E. Anderson, Sadieville, KY (US); Richard E. Corley, Jr., Richmond, KY (US); Paul T. Spivey, Lexington, KY (US); Carl E. Sullivan, Stamping Ground, KY (US)

(73) Assignee: Lexmark International, Inc., Lexington, KY (US)

( * ) Notice: Subject to any disclaimer, the term of this patent is extended or adjusted under 35 U.S.C. 154(b) by 394 days.

(21) Appl. No.: 11/062,019

(22) Filed: Feb. 18, 2005

(65) Prior Publication Data

US 2006/0187267 A1 Aug. 24, 2006

(51) Int. Cl.
*H01L 21/00* (2006.01)

(52) U.S. Cl. ............. 438/106; 438/21; 257/E21.001; 29/890.1

(58) Field of Classification Search ........... 438/21, 438/106; 29/890.1; 257/E21.001
See application file for complete search history.

(56) References Cited

U.S. PATENT DOCUMENTS

| 3,729,819 | A | 5/1973 | Horie |
| 3,800,020 | A | 3/1974 | Parfet |
| 4,532,152 | A | 7/1985 | Elarde |
| 4,604,678 | A | 8/1986 | Hagner |
| 4,614,837 | A | 9/1986 | Kane et al. |
| 4,985,601 | A | 1/1991 | Hagner |
| 5,114,744 | A | 5/1992 | Cloutier et al. |
| 5,250,758 | A | 10/1993 | Fjelstad et al. |
| 5,276,961 | A | 1/1994 | Matta et al. |
| 5,493,074 | A | 2/1996 | Murata et al. |
| 5,688,146 | A | 11/1997 | McGinley et al. |
| 5,763,058 | A | 6/1998 | Isen et al. |
| 6,010,771 | A | 1/2000 | Isen et al. |
| 6,177,921 | B1 | 1/2001 | Comiskey et al. |
| 6,248,449 | B1 | 6/2001 | Watanabe |
| 6,436,316 | B2 | 8/2002 | Matsumoto |
| 6,449,831 | B1 * | 9/2002 | Komplin et al. ............ 29/611 |
| 6,619,786 | B2 | 9/2003 | Cobb et al. |
| 6,639,578 | B1 | 10/2003 | Comiskey et al. |
| 6,697,694 | B2 | 2/2004 | Mogensen |

(Continued)

FOREIGN PATENT DOCUMENTS

JP 63-291493 11/1988

(Continued)

*Primary Examiner*—Michael Lebentritt
*Assistant Examiner*—Angel Roman
(74) *Attorney, Agent, or Firm*—Luedeka, Neely & Graham, PC

(57) ABSTRACT

Methods of connecting a circuit device to a semiconductor substrate and micro-fluid ejection devices made by the methods. One method includes printing an elongate strip of an electrically conductive fluid to electrically interconnect a first contact pad on a semiconductor substrate containing fluid ejection actuator devices with a second contact pad on an electrical trace circuit, wherein the electrical trace circuit is disposed adjacent to and spaced-apart from the semiconductor substrate. The electrically conductive fluid contains a liquid component and a conductive particle component. The liquid component is removed from the conductive particle component to provide a solid elongate strip of conductive material interconnecting the first contact pad and the second contact pad.

20 Claims, 5 Drawing Sheets

| U.S. PATENT DOCUMENTS | | | | FOREIGN PATENT DOCUMENTS | | |
|---|---|---|---|---|---|---|
| 6,713,389 B2 | 3/2004 | Speakman | | JP | 64-002392 A2 | 1/1989 |
| 6,737,589 B2 | 5/2004 | Adachi et al. | | JP | 10-64290 A2 | 3/1989 |
| 6,743,319 B2 | 6/2004 | Kydd | | JP | 62-52532 | 9/1994 |
| 6,750,547 B2* | 6/2004 | Jeung et al. ......... 257/778 | | JP | 2000-163549 | 6/2000 |
| 6,787,811 B2 | 9/2004 | Saito et al. | | JP | 2002-324966 | 11/2002 |
| 2003/0083203 A1* | 5/2003 | Hashimoto et al. ......... 505/100 | | JP | 2003-289179 | 10/2003 |
| 2003/0185971 A1 | 10/2003 | Saksa et al. | | WO | WO 01/03183 | 1/2001 |
| 2003/0209697 A1 | 11/2003 | Orsbon et al. | | WO | WO 02/054841 | 7/2002 |
| 2003/0228748 A1 | 12/2003 | Nelson et al. | | | | |
| 2004/0155322 A1* | 8/2004 | Cho et al. ......... 257/676 | | | | |

* cited by examiner

PRINTED CONDUCTIVE CONNECTORS

FIELD OF THE DISCLOSURE

The disclosure relates to micro-fluid ejection head structures and improved methods for making micro-fluid ejection heads.

BACKGROUND AND SUMMARY

Micro-fluid ejection devices continue to be used in a wide variety of applications, including ink jet printers, medical delivery devices, micro-coolers and the like. Of the uses, ink jet printers provide, by far, the most common use of micro-fluid ejection devices. Ink jet printers are typically more versatile than laser printers for some applications. As the capabilities of ink jet printers are increased to provide higher quality images at increased printing rates, fluid ejection heads, which are the primary printing components of ink jet printers, continue to evolve and become more complex.

For example, there is a trend toward use of smaller semiconductor substrates containing more fluid ejection actuators for ink jet printers. The substrates also contain contact pads thereon for providing electrical impulses to the fluid ejection actuators. In some conventional ink jet print heads, flexible circuits containing conductive leads are bonded to contact pads on the substrate. In other conventional ink jet print heads, conductive wires are bonded to the contact pads on the substrate and to contact pads on a flexible circuit. The bonds between the flexible circuit and the substrate can be made through techniques such as hot bar gang soldering or tape automated bonding (TAB).

In either case, the contact pads on the semiconductor substrate must be large enough and spaced far apart enough to enable an electrical connection between the flexible circuit and the substrate to be made. For example, a typical TAB contact pad on a print head substrate has the following dimensions: 283 µm×160 µm. The contact pad size may vary by 25% or more. Such size and spacing of contact pads on the substrate requires valuable substrate surface area to be provided for the contact pads.

In a typical print head, the semiconductor substrate is placed and bonded in a pocket or recessed area of a print head or fluid reservoir. An adhesive or protective underfill material is then used to fill in voids around the substrate to prevent fluid from contacting and corroding the underside of the conductive leads or wires. Because the leads or wires do not conform to the shape of the adhesive or underfill material, there is often a gap between the leads or wires and adhesive or underfill material. Such gap may allow fluid to enter and corrode the leads or wires.

Accordingly, there is a need for improved interconnections between a semiconductor substrate and a circuit device that will enable the use of smaller contact pads and further reduce corrosive effects of fluids on interconnections between the substrate and circuit device.

With regard to the foregoing and other objects and advantages there is provided a method of connecting a circuit device to a semiconductor substrate and a micro-fluid ejection device made by the method. In an exemplary embodiment, the method includes printing an elongate strip of an electrically conductive fluid to electrically interconnect a first contact pad on a semiconductor substrate containing fluid ejection actuator devices with a second contact pad on an electrical trace circuit, wherein the electrical trace circuit is disposed adjacent to and spaced-apart from the semiconductor substrate. The electrically conductive fluid contains a liquid component and a conductive particle component. Subsequently, removing the liquid component from the conductive particle component to provide a solid elongate strip of conductive material interconnecting the first contact pad and the second contact pad.

In another embodiment there is provided a micro-fluid ejection device. The micro-fluid ejection device includes a fluid reservoir body and a semiconductor substrate attached to the fluid reservoir body. The substrate contains fluid ejection actuators and first electrical contact pads electrically connected to the fluid ejection actuators. A circuit device is disposed adjacent to and spaced apart from the semiconductor substrate. The circuit device contains electrical trace circuits terminating in second electrical contact pads. Elongate strips of electrically conductive material are printed to electrically interconnect the first contact pads with the second contact pads.

An advantage of an exemplary embodiment of the disclosure may include providing interconnections across uneven surfaces wherein a printed conductive material conforms to the underlying surface thereby eliminating gaps between the printed connector and the underlying surface. Another advantage may be that conductors can be connected to smaller contact pads with more precision than when using conductive leads or wire bond connectors to make such interconnections.

BRIEF DESCRIPTION OF THE DRAWINGS

Further advantages of the disclosed embodiments will become apparent by reference to the detailed description of exemplary embodiments when considered in conjunction with the following drawings illustrating one or more non-limiting aspects of the embodiments, wherein like reference characters designate like or similar elements throughout the several drawings as follows.

DETAILED DESCRIPTION OF THE EXEMPLARY EMBODIMENTS

Figure 1:
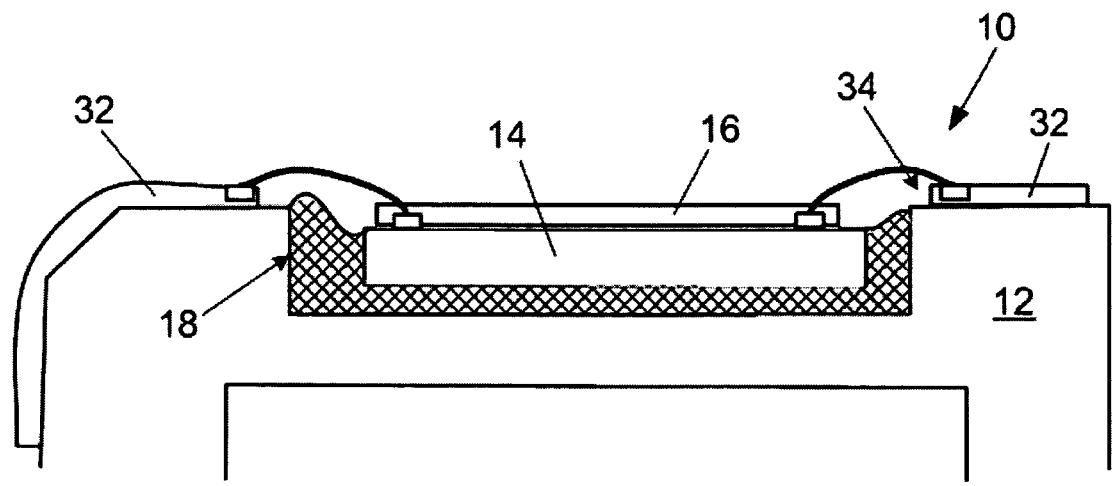
FIG. 1 is a cross-sectional view, not to scale, of a portion of a micro-fluid ejection head.
Figure 2:
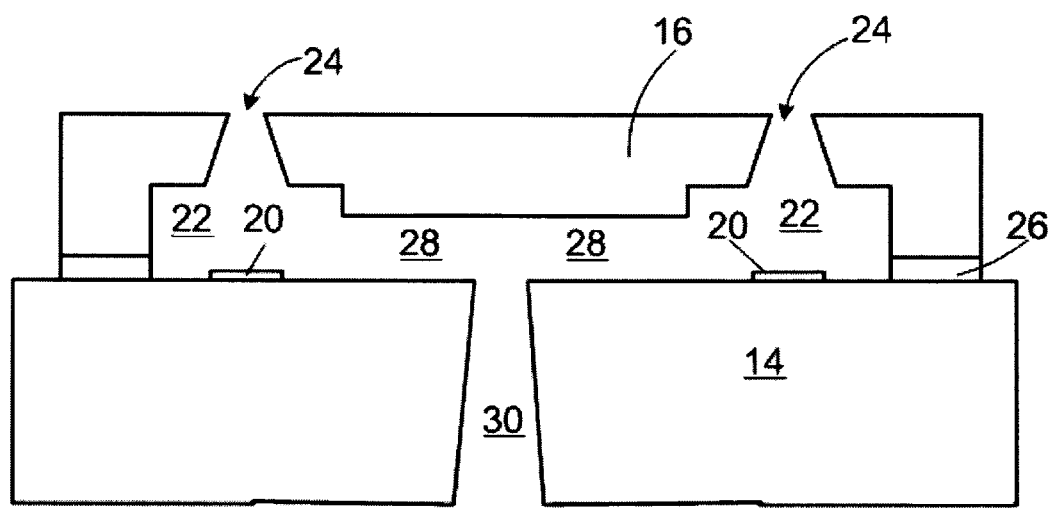
FIG. 2 is a cross-sectional view, not to scale, of a semiconductor substrate and nozzle plate for a micro-fluid ejection head.

With reference to FIGS. 1 and 2, there is shown a portion of a micro-fluid ejection head 10 having a fluid reservoir body 12 with a semiconductor substrate 14 and a nozzle plate 16 attached to the body in a recessed area, generally known as a chip pocket 18. The fluid reservoir body 12 is typically made from an electrically insulative material that is resistant to the fluid contained in the reservoir body 12 and is relatively thermally stable so that it does not substantially deform when exposed to heat generated by the semiconductor substrate 14. Suitable materials for the reservoir body include, but are not limited to, glass-filled polybutylene terephthalate available from G.E. Plastics of Huntersville, N.C. under the trade name VALOX 855, amorphous thermoplastic polyetherimide available from G.E. Plastics under the trade name ULTEM 1010, glass-filled thermoplastic polyethylene terephthalate resin available from E. I. du Pont de Nemours and Company of Wilmington, Del. under the trade name RYNITE, syndiotactic polystyrene containing glass fiber available from Dow Chemical Company of Midland, Mich. under the trade name QUESTRA, polyphenylene ether/polystyrene alloy resin available from G.E. Plastics under the trade names NORYL SE1 and NORYL 300X and polyamide/poly-phenylene ether alloy resin available from G.E. Plastics under the trade name NORYL GTX.

As seen in more detail in FIG. 2, the semiconductor substrate 14 includes fluid ejection actuators 20 thereon for heating a fluid in a fluid chamber 22 for ejection through nozzle holes 24 in the nozzle plate 16. The semiconductor substrate 14 is typically a single crystal silicon substrate containing a plurality of layers deposited thereon providing insulative layers, conductive layers, a resistive layer, protective layers, and/or dielectric layers for providing electrical pulses to the ejection actuators 20.

The nozzle plate 16 includes one or more materials attached to the semiconductor substrate as by an adhesive 26. A single nozzle plate material 16 made of a laser ablated polyimide material is illustrated in FIG. 2. However, the disclosure is not limited to a single nozzle plate material, as a separate nozzle plate containing only nozzle holes 24 may be attached to a thick film layer containing the fluid chambers 22, and fluid flow channels 28 for providing fluid from a slot 30 in the substrate 14 to the fluid chambers 22.

In order to provide electrical connections to the semiconductor substrate 14 to activate the ejection actuators 20 on the substrate, a flexible circuit or other circuit containing device 32 is attached to the fluid reservoir body 12. The circuit device 32 has a window 34 therein for the substrate 14 and nozzle plate 16.

Figure 3:
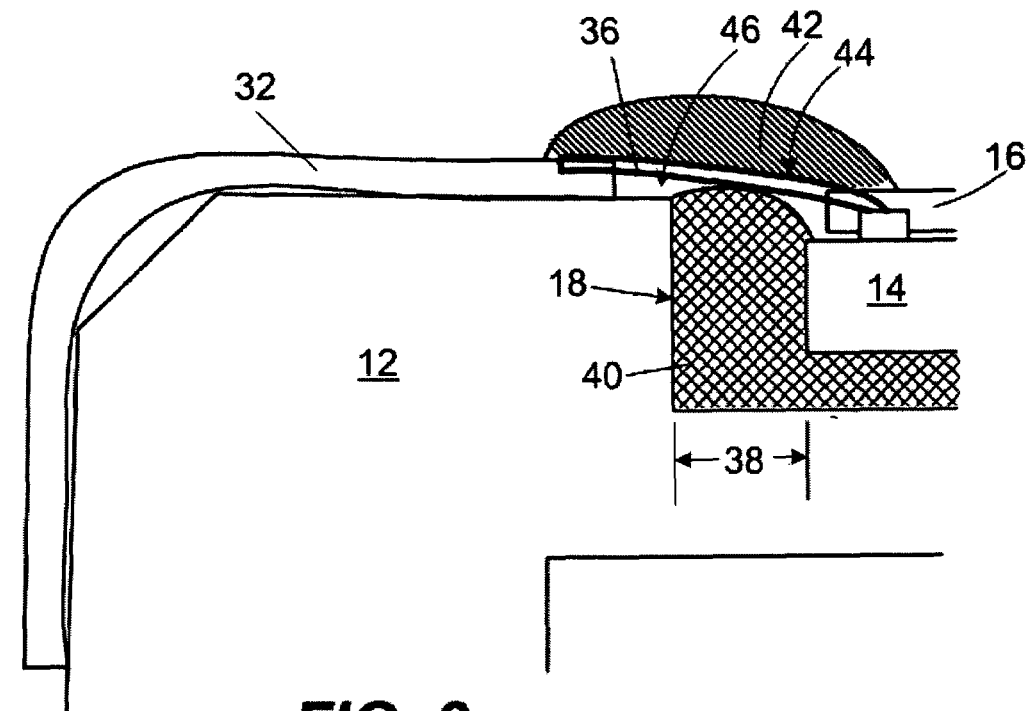
FIG. 3 is cross-sectional view, not to scale, of a portion of a prior art micro-fluid ejection head containing a flexible circuit with a conventional connection to a semiconductor substrate.

In conventional micro-fluid ejection heads, lead beams or wire bonds extend into the window 34 for electrical connection to contact pads on the substrate 14. A schematic representation of a conventional electrical connection 36 between a semiconductor substrate 14 and a flexible circuit 32 is illustrated in FIG. 3. As seen in FIG. 3, the connection 36 is disposed across a gap 38 between the substrate 14 and the reservoir body 12. The gap 38 is typically filled with an adhesive or underfill material 40 (hereinafter referred to collectively as "underfill material") that is urged toward the connection 36 to protect the connection 36 from corrosive fluids. An encapsulant material 42 such as a thermosettable adhesive is also applied to the connection 36 to protect a top side 44 of the connection from corrosion. However, as shown in FIG. 3, there is typically a void space 46 between the connection 36 and underfill material 40 that may allow fluid to attack the connection 36.

Materials which may be used as the underfill material 40 include an epoxy adhesive such as a die bond adhesive available from Emerson & Cuming of Monroe Township, N.J. under the trade name ECCOBOND 3193-17. The encapsulant 42 may be an epoxy adhesive that contains about 60 wt. % of a di-functional epoxy material, from about 20 to about 30 wt. % modified epoxy material. The di-functional epoxy material component of the encapsulant 42 may be selected from di-functional epoxy compounds which include diglycidyl ethers of bisphenol-F (e.g. those available under the trade designations "EPON 828", available from Resolution Performance Products of Houston, Tex., "DER-354", available from Dow Chemical Company of Midland, Mich. A suitable difunctional epoxy resin is a bisphenol-F/epichlorohydrin epoxy resin available from Shell Chemical Company of Houston, Tex. under the trade name EPON resin 828. The other epoxy component of the encapsulant 42 may be a modified epoxy resin, such as a urethane-modified epoxy resin, a butadiene-acrylonitrile-modified epoxy resin, or an epoxidized bisphenol-A novalac resin.

For the sake of simplicity, FIGS. 4-9 do not include the encapsulant 42, however, such encapsulant may be provided by a formulation containing a solid resin, glycerol, a surfactant and 2-propanol.

Figure 4:
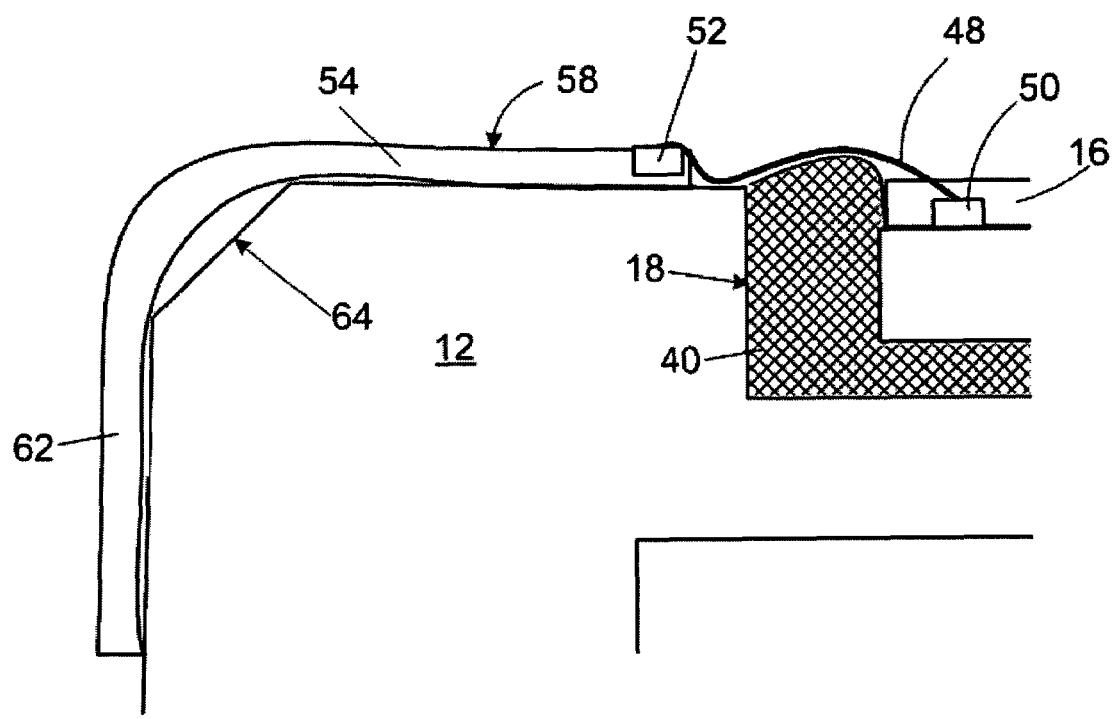
FIG. 4 is a cross-sectional view, not to scale, of a portions of a fluid reservoir body and a portion of a micro-fluid ejection head containing printed conductive connectors according to a first embodiment of the disclosure.

In order to substantially eliminate the gap 46 between the connector 44 and underfill material 40, an elongate strip 48 of electrically conductive material is printed to connect a first contact pad 50 on the semiconductor substrate 14 with a second contact pad 52 on an electrical trace circuit 54 as shown in FIG. 4. In an exemplary embodiment, the electrically conductive material may be printed using a mono-color ink jet print head available from Lexmark International, Inc. of Lexington, Ky. under model number 18C0032.

The electrically conductive material for printing the elongate strip 48 may be selected from an ink containing metal particles selected from silver, gold, copper, or aluminum particles in an organic or aqueous ink base. The metal particles have an average size range of from about 10 to about 30 microns in diameter. A suitable ink formulation containing metal particles for printing may include, but is not limited to, silver particles dispersed at about 30 percent by weight solids in an aqueous formulation containing from about 5 to about 30 percent by weight humectants, from about 0.1 to about 5 percent by weight surfactants. A dispersion of conductive particles, such as silver particles, useful for making such an ink formulation is available from Nippon Paint Company, Ltd. of Osaka, Japan under the trade designation FINE SPHERE SVW102. Other commercially available conductive particle dispersions or fully formulated conductive ink compositions may also be used.

An advantage of printing the elongate connector strip 48 may be that the strip 48 can be printed over a variety of shapes and contours thereby substantially eliminating any gap between the underfill material 40 and the connector strip 48 as shown in FIG. 4. Another advantage of printing an elongate strip 48 to electrically connect the first contact pad 50 on the substrate 14 with the second contact pad 52 on the electrical trace circuit 54 may be that a simpler trace circuit 54 can be used thereby eliminating lead beams that extend into a window 34 adjacent the substrate 14 as described above with reference to FIG. 1. Still another advantage of using a printed elongate strip 48 as the electrical connector between the first contact pad 50 and the second contact pad 52 may be that a smaller first contact pad 50 can be used on the substrate 14 thereby reducing the size of substrate material needed for the substrate 14. For example, a first contact pad having a length of about 21 microns may be used with the elongate strip connector 48 as opposed to a contact pad length of about 160 microns with connector 36 (FIG. 3) due to an ability to more accurately print the elongate strip 48 compared to making a connection as shown in FIG. 3 by conventional TAB or wire bonding methods. As shown in FIG. 4, the trace circuit 54 may be a flexible etched cable connector with copper traces 56 (FIGS. 6A-6B) adjacent a first surface 58 thereof terminating in the second contact pad 52 also located adjacent the first surface 58 of the circuit 54.

Figure 5A:
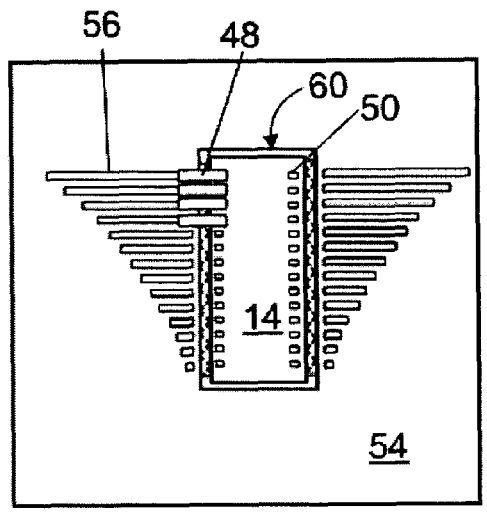
FIGS. 5A and 5B are top plan views, not to scale, of a portion of a printed connection according to the first embodiment of the disclosure.
Figure 5B:
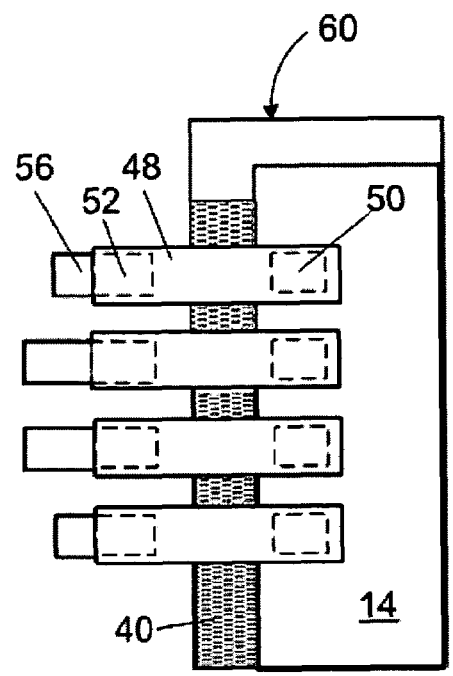

A plan view of the cable connector 54 of FIG. 4 is illustrated in FIG. 5A and in enlarged section in FIG. 5B. As shown in FIG. 5A, the cable connector trace circuit 54 has a window 60 therein for access to the contact pads 50 on the substrate 14. The conductive elongate strip 48 is printed so that there is electrical contact between contact pad 50 on the substrate 14 and the contact pad 52 at the terminal end of the copper traces 56. Unlike conventional flexible circuits, the trace circuit 54 according to the disclosure does not require lead beams extending into the window 60 to connect to the contact pads 50 on the substrate 14.

The printed elongate strip 48 spans a portion of the substrate 14, the underfill material 40 and a portion of the trace circuit 54 and can be printed over a variety of surfaces and surface elevations making the elongate strip 48 a more flexible means for attaching the trace circuit 54 to the semiconductor substrate 14. A portion 62 of the trace circuit 54 may be bent around an edge 64 of the reservoir body 12 (FIG. 4) to provide a surface for contact pads to a circuit control device for controlling ejection actuators 20 on the substrate 14.

Figure 6:
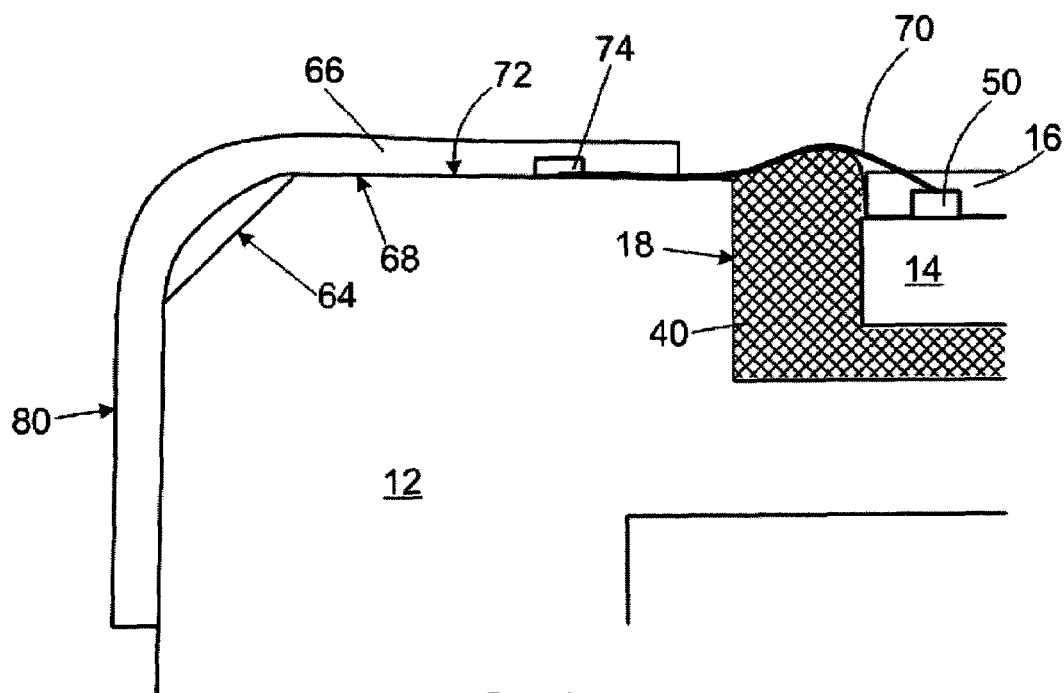
FIG. 6 is a cross-sectional view, not to scale, of a portions of a fluid reservoir body and a portion of a micro-fluid ejection head containing printed conductive connectors according to a second embodiment of the disclosure.

In an alternative embodiment, illustrated in FIG. 6, copper traces are provided on an etch trace circuit cable 66 adjacent a second surface 68 of the trace circuit 66. In this embodiment, the elongate connector strips 70 may be printed over the underfill material 40 and onto an insulated surface 72 of the reservoir body 12. Second contact pads may be provided as conductive bumps 74 on the second surface 68 of the trace circuit cable 66. The conductive bumps 74 are aligned with the printed elongate connector strips 70 to electrically connect between the first contact pads 50 to the circuit cable 66.

Figure 7A:
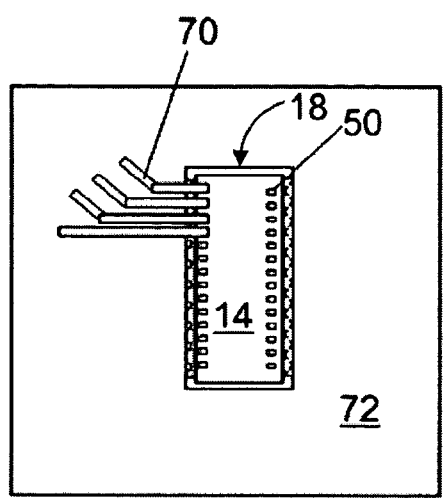
FIGS. 7A and 7B are top plan views, not to scale, of a portion of a printed connection according to the second embodiment of the disclosure.
Figure 7B:
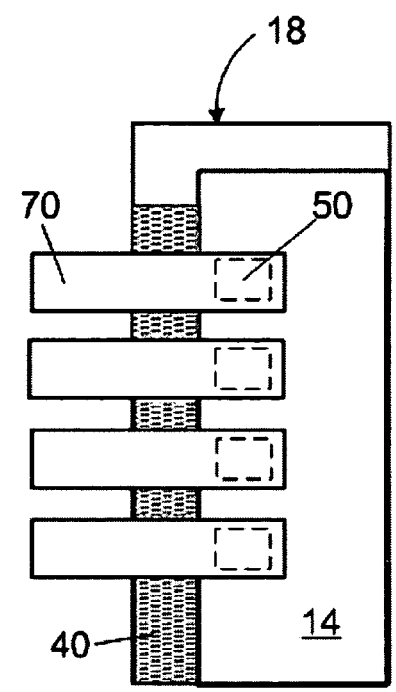

A plan view of the printed elongate strips 70 electrically connecting the first contact pads 50 with the conductive bumps 74 is illustrated in FIG. 7A. An enlarged portion of the plan view of FIG. 7A is shown in FIG. 7B. In FIG. 7A, the substrate 14 containing the first contact pads 50 is disposed in the chip pocket 18 of the fluid reservoir body 12. The printed elongate strips 70 are printed onto a portion of the substrate 14, onto the underfill material 40, and onto the insulated surface 72 of the fluid reservoir body 12 to electrically connect the first contact pads 50 with the conductive bumps 74 on the circuit cable 66. As with the embodiment of FIG. 4, a portion 80 of the circuit cable 66 may be bent around an edge 64 of the fluid reservoir body 12 (FIG. 6) to provide a surface for contact pads to a circuit control device for controlling ejection actuators 20 on the substrate 14.

Figure 8:
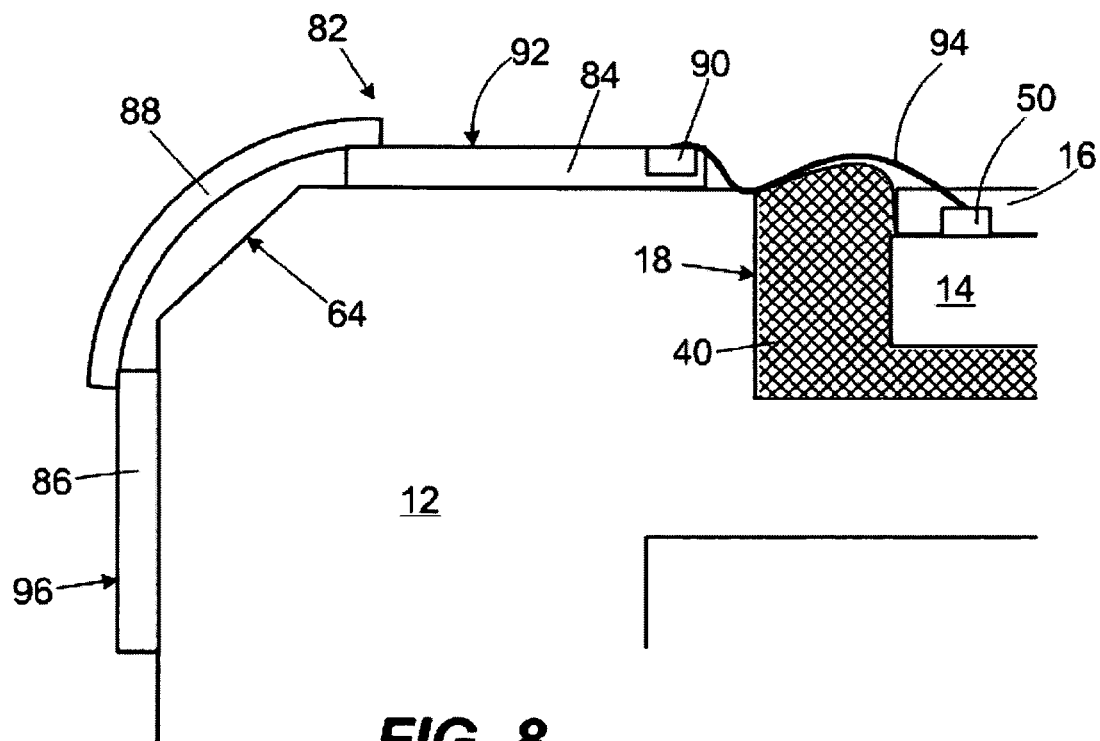
FIGS. 8 and 9 are cross-sectional views, not to scale, of portions of micro-fluid ejection heads and portions of fluid reservoir bodies containing printed conductive connectors according to other embodiments of the disclosure.
Figure 9:
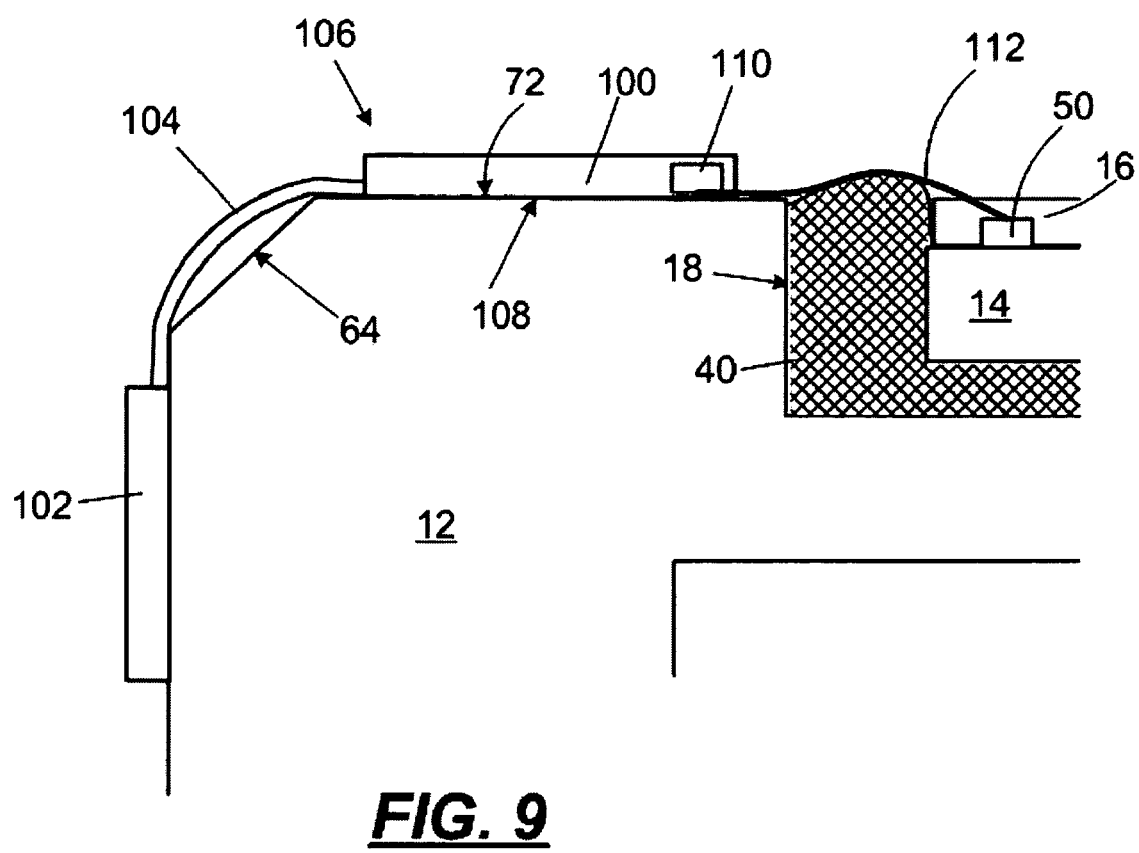

Alternate embodiments for trace circuits are illustrated in FIGS. 8 and 9. In FIG. 8, the trace circuit 82 includes a first printed circuit board 84 electrically connected to a second circuit board 86 through a flexible conductive cable connector 88. The circuit boards 84 and 86 contain printed circuit traces with contact pads on terminal ends thereof. A second contact pad 90 is provided adjacent a first surface 92 of the first circuit board 84 for connection through an elongate printed conductor strip 94 to the first contact pad 50 on the semiconductor substrate 14. Likewise, the cable connector 88 is attached to contacts on the first and second printed circuit boards 84 and 86 adjacent the first surface 92 of the first circuit board 84 and a first surface 96 of the second circuit board 86. Contact pads for connecting the reservoir body 12 to a circuit control device for controlling the ejection actuators 20 on the substrate 14 are provide on the first surface 96 of the second circuit board 86. The elongate conductive strips 94 are printed onto a portion of the substrate, the underfill material 40 and onto the first surface 92 of the first circuit board 84. A plan view of the printed elongate strips 94 and trace circuit 82 of FIG. 8 is illustrated in a manner similar to FIGS. 5A and 5B.

Another alternative embodiment of the disclosure is illustrated in FIG. 9. In this embodiment, first and second circuit boards 100 and 102, and a flexible conductive trace cable 104 are used as the trace circuit 106. However, unlike the embodiment in FIG. 8, the conductive traces printed on the circuit boards 100 and 102 are on a surface 108 adjacent the insulated surface 72 of the fluid reservoir body 12. As with the embodiment of FIG. 6, conductive bumps 110 are provided on the surface 108 of the first printed circuit board 100. Accordingly, elongate conductive strips 112 are printed onto a portion of the substrate 14, the underfill material and onto the insulated surface 72 of the fluid reservoir body 12 for electrical connection between the first contact pads 50 and the conductive bumps 110. A plan view of the printed elongate strips 112 and trace circuit 106 of FIG. 9 is illustrated in a manner similar to FIGS. 7A and 7B.

It is contemplated, and will be apparent to those skilled in the art from the preceding description and the accompanying drawings, that modifications and changes may be made in the exemplary embodiments. Accordingly, it is expressly intended that the foregoing description and the accompanying drawings are illustrative of the exemplary embodiments only, not limiting thereto, and that the true spirit and scope of the present disclosure be determined by reference to the appended claims.

What is claimed is:

1. A method of connecting a circuit device to a semiconductor substrate, the method comprising:
   printing an elongate strip of an electrically conductive fluid to electrically interconnect a first contact pad on a semiconductor substrate including fluid ejection actuators with a second contact pad on an electrical trace circuit, the electrical trace circuit being disposed adjacent to and spaced-apart from the semiconductor substrate, wherein the electrically conductive fluid contains a liquid component and a conductive particle component; and
   subsequently, removing at least a substantial portion of the liquid component from a substantial portion of the conductive particle component to provide a substantially solid elongate strip of conductive material interconnecting the first contact pad and the second contact pad.

2. The method of claim 1, further comprising applying a protective material to the solid elongate strip of conductive material.

3. The method of claim 1, wherein the second contact pad is disposed on a first side of the electrical trace circuit.

4. The method of claim 1, wherein the second contact pad is disposed on a second side of the electrical trace circuit.

5. The method of claim 4, wherein the elongate strip of electrically conductive fluid is printed on the first contact pad on the semiconductor substrate and on an insulated surface disposed adjacent to and spaced apart from the semiconductor substrate, further comprising attaching the second contact pad to the elongate strip of electrically conductive fluid on the insulated surface to interconnect the first contact pad with the second contact pad.

6. The method of claim 1, wherein the electrical trace circuit comprises a printed circuit board.

7. The method of claim 1, wherein the electrical trace circuit comprises a flexible circuit device.

8. The method of claim 1, wherein the elongate strip of electrically conductive fluid is printed over an underfill material disposed between the substrate and electrical trace circuit.

9. The method of claim 1, wherein the act of removing the liquid component from the conductive particle component comprises heating the printed elongate strip to fuse the conductive particles to one another in the conductive particle component.

10. A micro-fluid ejection head comprising the semiconductor substrate and circuit device interconnected by the method of claim 1.

11. A micro-fluid ejection device comprising:
    a fluid reservoir body;
    a semiconductor substrate attached in fluid flow communication with the fluid reservoir body, the substrate containing fluid ejection actuators and first electrical contact pads electrically connected to the fluid ejection actuators;
    a circuit device disposed adjacent to and spaced apart from the semiconductor substrate, the circuit device containing electrical trace circuits terminating in second electrical contact pads; and
    elongate strips of electrically conductive material printed to electrically interconnect the first contact pads with the second contact pads.

12. The micro-fluid ejection device of claim 11, further comprising a protective material applied to the elongate strips of electrically conductive material.

13. The micro-fluid ejection device of claim 11, wherein the second contact pads are disposed on a first side of the circuit device.

14. The micro-fluid ejection device of claim 11, wherein the second contact pads are disposed on a second side of the circuit device.

15. The micro-fluid ejection head of claim 14, wherein the elongate strips of electrically conductive fluid are printed on the first contact pads on the semiconductor substrate and on an insulated surface disposed adjacent to and spaced apart from the semiconductor substrate, wherein the second contact pads on the circuit device are electrically connected to the elongate strips on the insulated surface to interconnect the first contact pads with the second contact pads.

16. The micro-fluid ejection device of claim 11, wherein the circuit device comprises a printed circuit board.

17. The micro-fluid ejection device of claim 11, wherein the circuit device comprises a flexible circuit device.

18. The micro-fluid ejection device of claim 11, further comprising an underfill material disposed between the semiconductor substrate and the circuit device, wherein the printed elongate strips of electrically conductive material are printed over the underfill material.

19. A method of connecting a circuit device to a semiconductor substrate, the method comprising:
    printing an electrically conductive fluid to electrically interconnect a first contact pad on a semiconductor substrate with a second contact pad on an electrical trace circuit, the electrical trace circuit being disposed adjacent to and spaced-apart from the semiconductor substrate, wherein the electrically conductive fluid contains a liquid component and a conductive particle component; and
    subsequently, removing at least a substantial portion of the liquid component from a substantial portion of the conductive particle component to provide a substantially solid elongate strip of conductive material interconnecting the first contact pad and the second contact pad.

20. A micro-fluid ejection device comprising a circuit device and a semiconductor substrate connected in accordance with the method of claim 19, wherein the semiconductor substrate includes fluid ejection actuators.

* * * * *